(12) United States Patent
Iida

(10) Patent No.: US 7,725,652 B2
(45) Date of Patent: May 25, 2010

(54) STORAGE AND REPRODUCTION APPARATUS

(75) Inventor: Kenichi Iida, Saitama (JP)

(73) Assignee: Sony Corporation, Tokyo (JP)

( * ) Notice: Subject to any disclaimer, the term of this patent is extended or adjusted under 35 U.S.C. 154(b) by 308 days.

(21) Appl. No.: 11/742,641

(22) Filed: May 1, 2007

(65) Prior Publication Data

US 2007/0195665 A1 Aug. 23, 2007

Related U.S. Application Data

(60) Continuation of application No. 10/870,195, filed on Jun. 17, 2004, now Pat. No. 7,313,647, which is a division of application No. 10/043,506, filed on Jan. 10, 2002, now Pat. No. 6,775,753, which is a division of application No. 09/703,885, filed on Nov. 1, 2000, now Pat. No. 6,339,814, which is a division of application No. 09/128,744, filed on Aug. 4, 1998, now Pat. No. 6,490,235.

(30) Foreign Application Priority Data

Aug. 7, 1997 (JP) .................................... 9-213656
Aug. 8, 1997 (JP) .................................... 9-215209

(51) Int. Cl.
*G06F 12/00* (2006.01)
*G06F 13/00* (2006.01)

(52) U.S. Cl. ...................... 711/115; 711/100; 711/151; 711/161

(58) Field of Classification Search ................ 711/100, 711/103, 115, 154, 161, 162, 47.1; 369/47.1
See application file for complete search history.

(56) References Cited

U.S. PATENT DOCUMENTS 4,939,601 A 7/1990 Endo et al.

(Continued)

FOREIGN PATENT DOCUMENTS

JP 63-303399 12/1988

(Continued)

*Primary Examiner*—Tuan V. Thai
(74) *Attorney, Agent, or Firm*—Oblon, Spivak, McClelland, Maier & Neustadt, L.L.P.

(57) ABSTRACT

The storage and reproducing apparatus includes a signal processing block, a memory, a reproduction block, an operation block, and a control block. The signal processing block converts a sound signal entered, into a digital signal. The memory stores a digital signal outputted form the signal processing block and a management data of the digital data. The reproduction block at least converts a digital signal read out from the memory, into a hearable sound for reproduction output. The operation block is provided on an apparatus main body and includes a rotary operation block provided on the apparatus main body in such a manner that the rotary operation block can be rotated around a rotation center and shifted along plane which almost orthogonally intersects the rotation center. The control block, according to an input from the operation block, writes a digital signal and a management data into the memory and reads out a digital signal and a management data stored in the memory. The control block, according to a rotation direction of the rotary operation block, reads out a management data from the memory. When the rotary operation block is shifted along the plane, the control block reads out a digital signal from the memory according to a management information which is being read out from the memory.

32 Claims, 15 Drawing Sheets

U.S. PATENT DOCUMENTS

| | | | |
|---|---|---|---|
| 5,134,497 A | | 7/1992 | Kim |
| 5,640,194 A | * | 6/1997 | Suzuki et al. .................. 725/92 |
| 5,822,542 A | | 10/1998 | Smith et al. |
| 5,857,058 A | | 1/1999 | Iwamoto et al. |
| 5,974,225 A | | 10/1999 | Iwamoto et al. |
| 6,009,236 A | * | 12/1999 | Mishima et al. ............. 386/111 |
| 6,011,870 A | * | 1/2000 | Jeng et al. ................... 382/236 |
| 6,069,995 A | | 5/2000 | Sugiyama et al. |
| 6,144,797 A | | 11/2000 | MacCormack et al. |
| 6,212,330 B1 | * | 4/2001 | Yamamoto et al. ............ 386/95 |

FOREIGN PATENT DOCUMENTS

| | | |
|---|---|---|
| JP | 64-27061 | 1/1989 |
| JP | 3-29144 | 2/1991 |
| JP | 3-54753 | 3/1991 |
| JP | 3-147453 | 6/1991 |
| JP | 5-242688 | 9/1993 |
| JP | 7-20899 | 1/1995 |
| JP | 7-65551 | 3/1995 |
| JP | 7-114399 | 5/1995 |
| JP | 7-123147 | 5/1995 |
| JP | 7-141777 | 6/1995 |
| JP | 8-79366 | 3/1996 |
| JP | 8-307535 | 11/1996 |
| JP | 9-127999 | 5/1997 |
| JP | 9-179599 | 7/1997 |

* cited by examiner

| ADDRESS | CONTENTS |
|---|---|
| 0 Byte | FOR ETERNAL BLOCK RECOGNITION |
| 1 Byte | FOR ETERNAL BLOCK RECOGNITION |
| 2 Byte | FOR ETERNAL BLOCK RECOGNITION |
| 3 Byte | FOR ETERNAL BLOCK RECOGNITION |
| 4, 5 Byte | ETERNAL BLOCK ADDRESS |
| 6, 7 Byte | INDEX STAGE 0 ADDRESS |
| 8, 9 Byte | INDEX STAGE 1 ADDRESS |
| 10, 11 Byte | WORK AREA BLOCK START ADDRESS (UPPER) |
| 12 Byte | DUMMY DATA |
| ↓ | ↓ |
| 15 Byte | DUMMY DATA |
| 16 Byte | BLANK MAP |
| ↓ | BLANK MAP |
| 143 Byte | BLANK MAP |
|  | NO DATA (0 × FF) |

FIG.4

| PAGE | CONTENTS |
|---|---|
| Page 0 | ADR DATA BLOCK |
| Page 1 | (PCM DATA START AND END ADDRESS, SP/LP) |
| Page 2 | 6 Byte × (469×2 block) = 5628 byte |
| Page 3 | 5628 byte = 10.99 page |
| Page 4 | |
| Page 5 | |
| Page 6 | |
| Page 7 | |
| Page 8 | |
| Page 9 | |
| Page 10 | |
| Page 11 | |
| Page 12 | HDR DATA BLOCK |
| Page 13 | (PRIORITY, ALARM DATA) |
| Page 14 | 8 byte × 99 PIECES = 792 byte |
| Page 15 | 792 byte = 1.55 page |

FIG.5

| | | | | | | | | | | | | | | | | | |
|---|---|---|---|---|---|---|---|---|---|---|---|---|---|---|---|---|---|
| 01 | SP | STH | STM | ENH | ENM | 01 | SP | STH | STM | ENH | ENM | 02 | SP | STH | STM | ENH | ENM |
| 03 | SP | STH | STM | ENH | ENM | 03 | SP | STH | STM | ENH | ENM | 03 | SP | STH | STM | ENH | ENM |
| 03 | SP | STH | STM | ENH | ENM | 04 | SP | STH | STM | ENH | ENM | 05 | SP | STH | STM | ENH | ENM |
| 06 | SP | STH | STM | ENH | ENM | FF | FF | FF | FF | FF | FF | FF | FF | FF | FF | FF | FF |
| FF | FF | FF | FF | FF | FF | FF | FF | FF | FF | FF | FF | FF | FF | FF | FF | FF | FF |
| FF | FF | FF | FF | FF | FF | FF | FF | FF | FF | FF | FF | FF | FF | FF | FF | FF | FF |
| FF | FF | FF | FF | FF | FF | FF | FF | FF | FF | FF | FF | FF | FF | FF | FF | FF | FF |
| FF | FF | FF | FF | FF | FF | FF | FF | FF | FF | FF | FF | FF | FF | FF | FF | FF | FF |

SP : SP OR LP
STH : START ADDRESS (UPPER)
STM : START ADDRESS (LOWER)
ENH : END ADDRESS (UPPER)
ENM : END ADDRESS (LOWER)

FIG.6

| 01 | PRI | ALM | AMO | ADA | AHO | AMI | AOW | 02 | PRI | ALM | AMO | ADA | AHO | AMI | AOW |
|----|-----|-----|-----|-----|-----|-----|-----|----|-----|-----|-----|-----|-----|-----|-----|
| 03 | PRI | ALM | AMO | ADA | AHO | AMI | AOW | 04 | PRI | ALM | AMO | ADA | AHO | AMI | AOW |
| 05 | PRI | ALM | AMO | ADA | AHO | AMI | AOW | 06 | PRI | ALM | AMO | ADA | AHO | AMI | AOW |
| FF | FF | FF | FF | FF | FF | FF | FF | FF | FF | FF | FF | FF | FF | FF | FF |
| FF | FF | FF | FF | FF | FF | FF | FF | FF | FF | FF | FF | FF | FF | FF | FF |
| FF | FF | FF | FF | FF | FF | FF | FF | FF | FF | FF | FF | FF | FF | FF | FF |
| FF | FF | FF | FF | FF | FF | FF | FF | FF | FF | FF | FF | FF | FF | FF | FF |
| FF | FF | FF | FF | FF | FF | FF | FF | FF | FF | FF | FF | FF | FF | FF | FF |

PRI : PRIORITY
ALM : ALARM SET
AMO : ALARM MONTH
ADA : ALARM DAY
AHO : ALARM HOUR
AMI : ALARM MINUTE
AOW : ALARM DAY OF WEEK

FIG.7

| PAGE | CONTENTS |
|---|---|
| Page 0 | VALID MARK (0 Byte) |
| Page 1 | MODE INTERRUPT MARK (1 Byte) |
| Page 2 | Blank Map (0 ~ 127 Byte) |
| Page 3 | Eternal block Blank Map (0 ~ 127 Byte) |
| Page 4 | |
| Page 5 | |
| Page 6 | |
| Page 7 | |
| Page 8 | |
| Page 9 | |
| Page 10 | |
| Page 11 | |
| Page 12 | |
| Page 13 | |
| Page 14 | |
| Page 15 | |

FIG.8

| ADDRESS | CONTENTS |
|---|---|
| 0 Byte | ID No. |
| 1 Byte | SP/LP INFORMATION |
| 2 Byte | PCM DATA STORAGE START ADDRESS (UPPER) |
| 3 Byte | PCM DATA STORAGE START ADDRESS (LOWER) |
| 4 Byte | PCM DATA STORAGE END ADDRESS (UPPER) |
| 5 Byte | PCM DATA STORAGE END ADDRESS (LOWER) |

FIG.9

| ADDRESS | CONTENTS |
|---|---|
| 0 Byte | PCM DATA |
| 1 Byte | PCM DATA |
| ↓ | PCM DATA |
| 510 Byte | PCM DATA |
| 511 Byte | PCM DATA |
| 512 Byte | YEAR DATA |
| 513 Byte | MONTH DATA |
| 514 Byte | DAY DATA |
| 515 Byte | HOUR DATA |
| 516 Byte | MINUTE DATA |
| 517 Byte | SECOND DATA |
| 518 Byte | DAY OF WEEK |
| 519 Byte | CLOCK SET FLAG |
| 520 Byte | NO DATA (0 × FF) |
| ↓ | |
| 527 Byte | |

FIG.10

| 01 | SP | STH | STM | ENH | ENM | 01 | SP | STH | STM | ENH | ENM | 02 | SP | STH | STM | ENH | ENM |
|---|---|---|---|---|---|---|---|---|---|---|---|---|---|---|---|---|---|
| 02 | SP | STH | STM | ENH | ENM | 03 | SP | STH | STM | ENH | ENM | 03 | SP | STH | STM | ENH | ENM |
| 03 | SP | STH | STM | ENH | ENM | 03 | SP | STH | STM | ENH | ENM | 04 | SP | STH | STM | ENH | ENM |
| 05 | SP | STH | STM | ENH | ENM | 06 | FF | FF | FF | FF | FF | FF | FF | FF | FF | FF | FF |
| FF | FF | FF | FF | FF | FF | FF | FF | FF | FF | FF | FF | FF | FF | FF | FF | FF | FF |
| FF | FF | FF | FF | FF | FF | FF | FF | FF | FF | FF | FF | FF | FF | FF | FF | FF | FF |
| FF | FF | FF | FF | FF | FF | FF | FF | FF | FF | FF | FF | FF | FF | FF | FF | FF | FF |
| FF | FF | FF | FF | FF | FF | FF | FF | FF | FF | FF | FF | FF | FF | FF | FF | FF | FF |

SP : SP or LP
STH : START ADDRESS (UPPER)
STM : START ADDRESS (LOWER)
ENH : END ADDRESS (UPPER)
ENM : END ADDRESS (LOWER)

FIG.13

| SHAFT ROTATION | SIGNAL | OUTPUT WAVEFORM |
|---|---|---|
| CW (B DIRECTION) | α (BETWEEN TERMINATS a-c) | |
| | β (BETWEEN TERMINATS b-c) | |
| CCW (A DIRECTION) | α (BETWEEN TERMINATS a-c) | |
| | β (BETWEEN TERMINATS b-c) | |

EACH PAIR 15 PULSES 360°

STORAGE AND REPRODUCTION APPARATUS

CROSS-REFERENCE TO RELATED APPLICATIONS

This application is a Continuation of and claims the benefit of priority under 35 U.S.C. §120 from U.S. Ser. No. 10/870,195, filed Jun. 17, 2004, which is a Division of U.S. Pat. No. 6,775,753, issued Aug. 10, 2004, which is a Division of U.S. Pat. No. 6,339,814, issued Jan. 15, 2002, which is a Division of U.S. Pat. No. 6,490,235, issued Dec. 3, 2002 and claims the benefit of priority under 35 U.S.C. §119 from Japanese Patent Applications Nos. 09-215209, filed Aug. 8, 1997; and 09-213656, filed Aug. 7, 1997. The entire contents of each of the above applications are incorporated herein by reference.

BACKGROUND OF THE INVENTION

1. Field of the Invention

The present invention relates to a storage and reproduction apparatus, and in particular to a storage and reproduction apparatus using a semiconductor memory.

2. Description of the Prior Art

Nowadays, there are recording/reproduction apparatus which can easily be used for recording/reproducing a sound just like writing down contents of a lecture or discussion on a memo paper. Such a recording/reproduction apparatus uses a semiconductor memory as a recording medium for storing a sound signals as a predetermined number of files and the sound signal is reproduced to output a sound. More specifically, the recording/reproduction apparatus stores a sound data consisting of a plurality of files in a semiconductor memory and upon reproduction, successively reproduces the sound data, starting with an older file.

When writing down contents of a discussion on a memo notebook, the latest content is written on a later page of the memo notebook. Accordingly, when reading the contents afterward, it is necessary to turn pages to read the latest contents.

This inconvenience is also met in a recording/reproduction apparatus in a semiconductor apparatus which stores a latest sound as a last file in a semiconductor memory, which requires search of the file containing the latest sound prior to reproducing the latest sound.

Those files stored in memory can be erased when they have become unnecessary. However, when there is a necessity to reproduce a file or when new files are successively stored without any time to erase them, more important files tend to be recorded at the last write-in address or read-out address of memory. Accordingly, as more and more files are recorded, there will be contained more files which are scarcely to be assessed. Those files which are not so important are first to be read out from memory to be reproduced and the latest file which has been just recorded tends to be the last to be reproduced.

That is, when a user wants to reproduce a sound data of the latest important file, he/she needs to carry out an operation for search the target latest file from a plurality of files stored in memory. This requires a complicated operation procedures to read out a necessary file from memory and reproduce it.

In order to read out from memory and reproduce a target sound data in the aforementioned recording/reproduction apparatus using a semiconductor memory, a user needs to operate a plurality of operation buttons such as a reproduction button, forward direction search button, and reverse direction search button. More specifically, when a plurality of data pieces are recorded in a semiconductor memory, prior to reproduction, it is necessary to press a forward direction search button and a reverse direction search button to select a target data piece to be reproduced so that an index number of the target data piece is displayed in a display block of the apparatus. After this, a reproduction button is pressed so as to reproduce the target sound data. Here, if a plenty of index numbers are involved, the user needs to continuously press the search button so as to display the target index number.

SUMMARY OF THE INVENTION

It is therefore an object of the present invention to provide a storage and reproducing apparatus which resolves the above-mentioned problem.

According to the present invention, there is provided a storage and reproducing apparatus including a memory, a reproduction block, an operation block, and a control block. The memory stores a data entered and an auxiliary data for the entered data. The reproduction block reproduces a data which has been read out from the memory. The operation block is provided on an apparatus main body. The operation block includes a rotary operation block provided on the apparatus main body in such a manner that the rotary operation block can be rotated around a rotation center and shifted along a plane which almost orthogonally intersects the rotation center. The control block, according to an input from the operation block, carries out writing of a data and an auxiliary data into the memory and read-out of a data stored in the memory. The control block, according to the rotation direction of the rotary operation block, reads out an auxiliary data from the memory, and when the rotary operation block is moved in the direction of the plane, reads out a data from the memory so as to be reproduced by the reproduction block according to an auxiliary data read out from the memory.

According to another aspect of the present invention, there is provided a storage and reproducing apparatus including a memory, a reproduction block, an operation block, and a control block. The memory stores a data entered and a management data for the entered data. The reproduction block reproduces a data which has been read out from the memory. The operation block is provided on an apparatus main body. The control block, according to an input from the operation block, carries out writing of a data and a management data into the memory and read-out of a data stored in the memory. The control block rewrites a management data so that a new data written into the memory is read out prior to the data already stored in the memory.

According to still another aspect of the present invention, there is provided a storage and reproducing apparatus including a memory, a reproduction block, an operation block, and a control block. The memory stores a data entered and a management data for the entered data. The reproduction block reproduces a data which has been read out from the memory. The operation block is provided on an apparatus main body. The control block, according to an input from the operation block, carries out writing of a data and a management data into the memory and read-out of a data stored in the memory. The control block operates as follows. If an instruction of a data write is issued from the operation block during a reproduction operation by the reproduction block, the control block interrupts the reproduction operation by the reproduction block and starts a data write into the memory.

According to yet still another aspect of the present invention, there is provided a storage and reproducing apparatus including a signal processing block, a memory, a reproduction block, an operation block, and a control block. The signal processing block converts a sound signal entered, into a digital signal. The memory stores a digital signal outputted from the signal processing block and a management data for the digital signal. The reproduction block reproduces a digital signal which has been read out from the memory. The operation block is provided on an apparatus main body and includes a rotary operation block provided on the apparatus main body in such a manner that the rotary operation block can be rotated around a rotation center and shifted along a plane which almost orthogonally intersects the rotation center. The control block, according to an input from the operation block, carries out writing of a digital signal and a management data into the memory and read-out of a digital signal and a management data stored in the memory. The control block operates as follows. According to the rotation direction of the rotary operation block, the control block reads out a management data, and when the rotary operation block is moved along the aforementioned plane, the control block reads out a digital data from the memory according to a management data read out from the memory.

BRIEF DESCRIPTION OF DRAWINGS

FIG. 4 shows a configuration of an eternal block of the semiconductor memory.

FIG. 5 shows a configuration of an index stage block constituted by a file data of the semiconductor memory.

FIG. 6 shows a configuration of an ADR data block of the index stage block.

FIG. 7 shows a configuration of an HDR data block of the index stage block.

FIG. 8 shows a configuration of an index stage block constituted by a file data of the semiconductor memory.

FIG. 9 shows a configuration of a work area block of the semiconductor memory.

FIG. 10 shows a configuration of a PCM data block of the semiconductor memory.

FIG. 13 shows a configuration of an ADR data of the index stage block when a new sound data is additionally recorded as of ID number 02.

FIG. 15A is an external front view of the jog dial and FIG. 15B is an external rear view of the jog dial.

DETAILED DESCRIPTION OF PREFERRED EMBODIMENTS

Hereinafter, description will be directed to a storage and reproducing apparatus according to embodiments of the present invention with reference to the attached drawings. In the embodiments described below, explanation will be given on a recording/reproduction apparatus (hereinafter, referred to simply as an IC recorder) using a semiconductor memory for recording or reproducing a sound signal.

Figure 1:
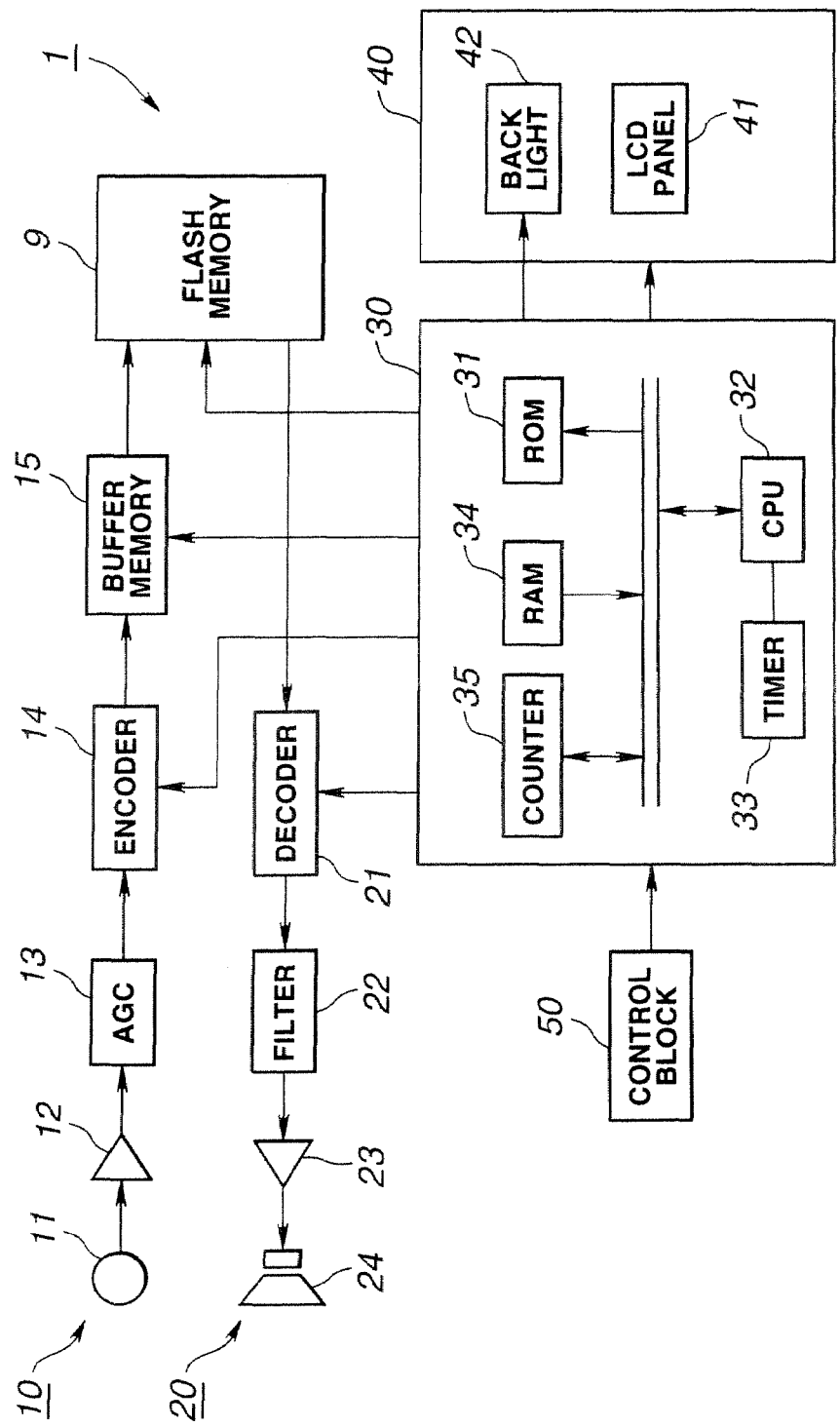
FIG. 1 is a block diagram showing a specific configuration of an IC recorder according to the present invention.

Referring to FIG. 1, this IC recorder 1 includes: a recording block 10 for converting an analog sound signal from a microphone 11, into a digital sound data and storing the digital sound data in a semiconductor memory 9; a reproduction block 20 for reading out the sound data stored in the semiconductor memory 9 and converting the read out sound data into an analog sound signal for reproduction output from a speaker 24; a control block 30 for controlling apparatus components including the recording block 10; a display block 40 for displaying an operation state and an operation procedure; and an operation block 50 through which a user enters various operations.

The recording block 10 has: an amplifier 12 for amplifying a an analog sound signal outputted from the microphone 11; an automatic gain controller (hereinafter, referred to as AGC) circuit for adjusting a level of the sound signal amplified by the amplifier 12; an encoder 14 for converting the sound signal from the AGC 13, into a sound data; and a buffer memory 15 for temporarily accumulating the sound data from the encoder 14.

In the recording block 10, the microphone 11 converts a speaker's voice into an analog signal for supply to the amplifier 12. The amplifier 12 amplifies the analog sound signal for supply to the AGC13. The AGC 13 amplifies the signal from the amplifier 12 so that the analog sound signal is at a proper level for supply to the encoder 14.

Because the analog sound signal supplied via the AGC 13 has a strong temporal correlation, the encoder 14 employs, for example, the adaptive differential pulse code modulation (hereinafter, referred to ADPCM) to encode an analog sound signal with a small data amount, to create a digital sound data and supplies the created sound data to the buffer memory 15. The encoder 14 can adjust a sound data coding amount according to two modes. For example, in an SP mode, a sound signal is sampled with an 8 kHz sampling frequency if in an SP mode and with a 4 kHz sampling frequency if in an LP mode so as to adjust a sound signal coding amount in the temporal axis direction.

The buffer memory 15 temporarily accumulates a sound data supplied from the encoder and supplies the accumulated data to the semiconductor memory 9.

The semiconductor memory 19 is constituted, for example, by an electrical erasable/programmable read only memory (hereinafter, referred to as an EEPROM), i.e., an non-volatile semiconductor memory which maintains a storage content of a storage element even if a memory drive power is turned off. This semiconductor memory 9 stores a sound data supplied from the buffer memory 15 and a management information (hereinafter, referred to as a TOC information) for carrying out a management, for example, which sound data is stored in which area. More specifically, the semiconductor memory 9 is, for example, a NAND type flash memory having a storage capacity of 4M×8 bits or 8×16 M bits, enabling to store a sound data corresponding to a sound signal of a predetermined frequency band for 30 minutes. For example, when the memory 9 has a storage capacity of 8×16 M bits, it is possible to store a sound data corresponding to a sound signal of 200 to 3400 Hz for 16 minutes in the aforementioned SP mode and to store a sound data corresponding to a sound signal of 200 to 1700 Hz for 24 minutes in the aforementioned LP mode.

On the other hand, the reproduction block 20, as shown in FIG. 1, has a decoder 21 for converting a sound signal read from the semiconductor memory 9, into a sound signal, a filter 22, and an amplifier 23 for amplifying the sound data from the filter 22 for supply to a loud speaker 24.

The decoder 21 corresponds to the encoder 14 of the recording block 10, and decodes a sound data which has been encoded by the ADPCM method, so as to create a so-called PAM signal. The filter 22 removes a high frequency component exceeding a voice frequency band from the PAM signal and outputs an analog sound signal. The amplifier 23 amplifies the analog sound signal supplied from the filter 22. The loud speaker 24 is driven according to a signal from the amplifier 23. Thus, a sound recorded in the memory 9 is outputted from the loud speaker 24.

The control block 30 includes: a ROM 31 containing a program for controlling the IC recorder; a microcomputer (hereinafter, referred to as a CPU) 32 for executing he program stored in the ROM 31 to control respective blocks; a random access memory (hereinafter, referred to as a RAM) 34 for temporarily storing the time of a timer 33 for creating a clock information, a program execution result, and the like; and a counter 35 for counting pulses supplied from a jog dial which will be detailed later. The control block 30, according to an operation setting of the operation block 50, carries out operation control of respective components of the apparatus 1.

The display block 40 displays an operation state of the IC recorder 1 and a sound data storage state according to a control signal from the control block 30 and includes a liquid crystal display panel 41 and a back light 42 for illuminating this liquid crystal display panel 41.

The operation block 50 supplies various input signals to the control block 30 when carrying out a sound recording/reproduction. The operation block 50 has various operation buttons, operation switches, and a jog dial to be operated by a user as will be detailed later. In the IC recorder 1, various output signals from these operation buttons/switches ad the jog dial are supplied to the control block 30.

The CPU 32 of the control block 30, according to a signal supplied from the operation block 50, reads out from the ROM 31 and executes a corresponding program and controls the respective blocks according to the program which has been read out. For example, if a recording start button which will be detailed later is pressed, the CPU 32 reads out from the ROM 31 and executes a program corresponding to a recording operation and controls to operate the amplifier 12, the AGC 13, the encoder 14, the display block 40, and the like according to the program which has been read out, so that a sound data temporarily accumulated in the buffer memory 15 is written in an empty area of the semiconductor memory, for example. For reproduction of a sound data, the CPU 32 reads out from the ROM 31 and executes a program corresponding to a reproduction operation and according to the program which has been read out, control to operate the decoder 21, the filter 22, the amplifier 23, the display block 40, and the like, so that a sound data stored in a predetermined area of the semiconductor memory 9 is read out and converted into an analog sound signal so as to be outputted from the loud speaker 24.

Thus, the control block 30 controls a sound data writing and reading out into/from the semiconductor memory 9 and write up to 99 sound data pieces, for example, into the semiconductor memory 9 by adding an index number to identify each of the sound data pieces. According to the index number added to each of the sound data pieces, the control block 30 controls to read out a target sound data piece from the semiconductor memory 9.

Figure 2:
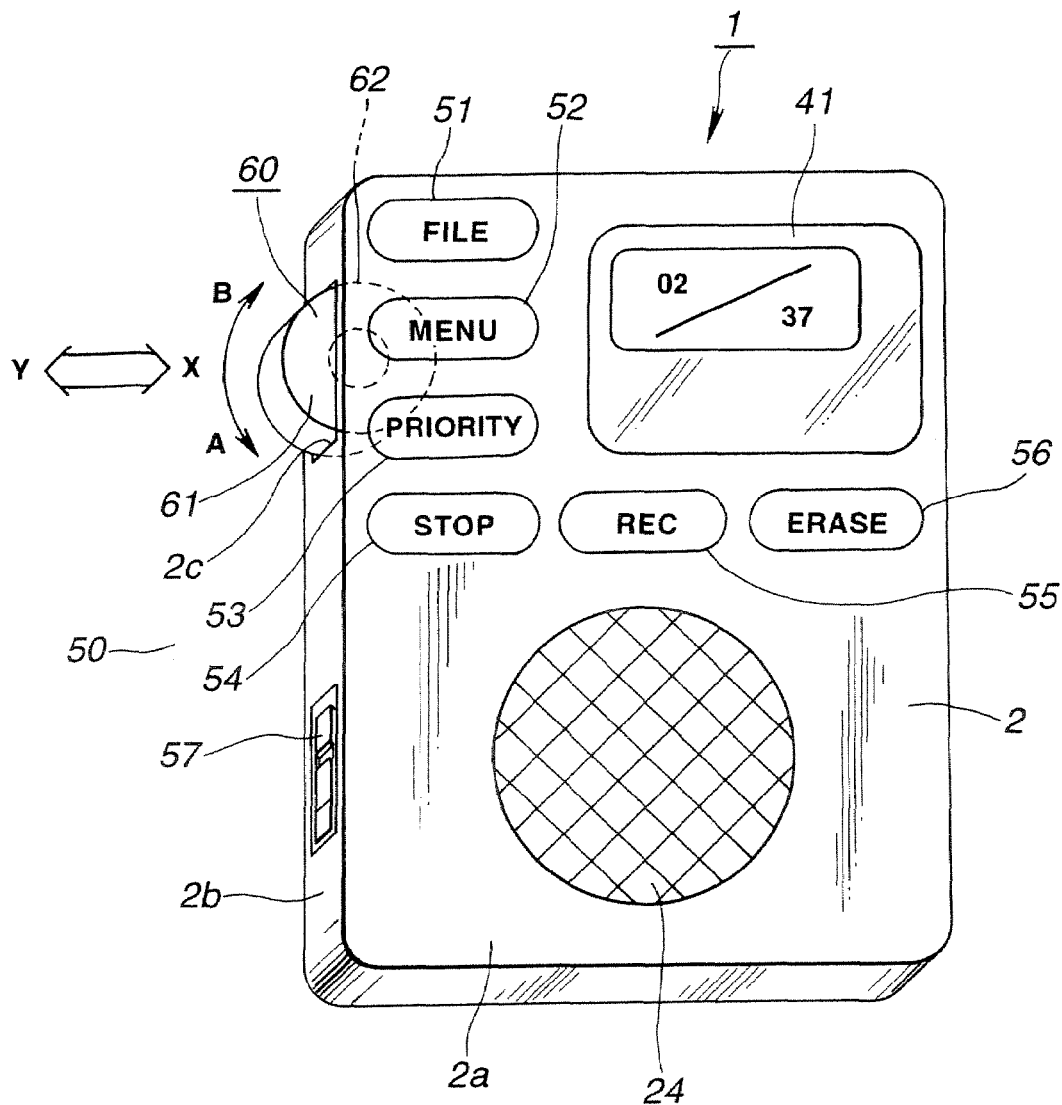
FIG. 2 is an external front view of the IC recorder.

Next, explanation will be given on the operation block 50 of the IC recorder 1 with reference to FIGS. 1 and 2. FIG. 2 is an external view briefly showing an external configuration of the IC recorder 1. The IC recorder shown in FIG. 2 is a portable type has an external casing 2 of a size to be grasped by one hand. In this external casing 2 is arranged a printed circuit board (not depicted) where the aforementioned electric circuits such as recording block 10 and the reproduction block 20 are mounted. On a main surface 2a of this external casing 2 are arranged the aforementioned liquid crystal display panel 41 an the loud speaker 24.

This IC recorder 1 has on the main surface 2a and side surfaces of the external casing 2, various operation buttons/switches 51 to 57 constituting the operation block 50 and the jog dial 60. The buttons and switches of the operation block 50 are arranged on the main surface 2a and the side surfaces of the casing 2 and can be operated with left hand fingers while the entire IC recorder 1 is held on the left hand palm so that a the user can continue a work such as writing with his/her right hand.

The operation buttons involved here are, as shown in FIG. 2, FILE button 51, MENU button 52, PRIORITY button 53, STOP button 54 for stopping a recording or the like, REC button 55 for starting a recording, and ERASE button for erasing a sound data stored in the semiconductor memory 9. These operation buttons are arranged on the main surface 2a for the external casing 2. A HOLD switch 57 of slide type is provided at a lower half of a left side surface 2b of the external casing 2. The operation block 50 also includes, although not depicted, a button for turning on the back light 42 of the liquid crystal display panel 41, a volume switch for adjusting loudness of a reproduced sound, an earphone jack, and the like which are arranged on a side surface of the external casing 2.

Here, the FILE button 51 is used to switch between a plurality of files set in the IC recorder 1. The term file corresponds to a directory or folder used in a personal computer. In this embodiment, five types of files are set beforehand. That is, in this IC recorder 1, each of he files can store up to 99 sound data pieces. The file types can be identified by displaying different icons on the liquid crystal display panel 41.

The MENU button 52 is used to operate during a stop state of recording/reproduction so as to modify the initial setting of the IC recorder 1 such as modification of a data and time, modification of a frequency band of a sound data to be recorded, modification of output of a beep sound and alarm sound given upon pressing of the operation buttons, modification of sensitivity of the microphone, and the like.

The PRIORITY button 53 is pressed during a reproduction operation or a stop state of the apparatus 1 so as to determine the reproduction priority for a sound stored in the memory 9. When this PRIORITY button 53 is pressed, an index number of a target sound data such as a data which is being reproduced is modified to a smaller number. In that file, a sound data having an index number modified by the PRIORITY button 53 is reproduced with a higher priority.

The HOLD switch 57 is used to maintain an operation state or a stop state of the IC recorder 1. When this HOLD switch 57 is in ON state, the IC recorder 1 is in a state not to accept operation of the operation buttons 51 to 56 and the jog dial 60.

The configuration of the jog dial 60 and a reproduction operation using the jog dial 60 will be detailed later.

Figure 3:
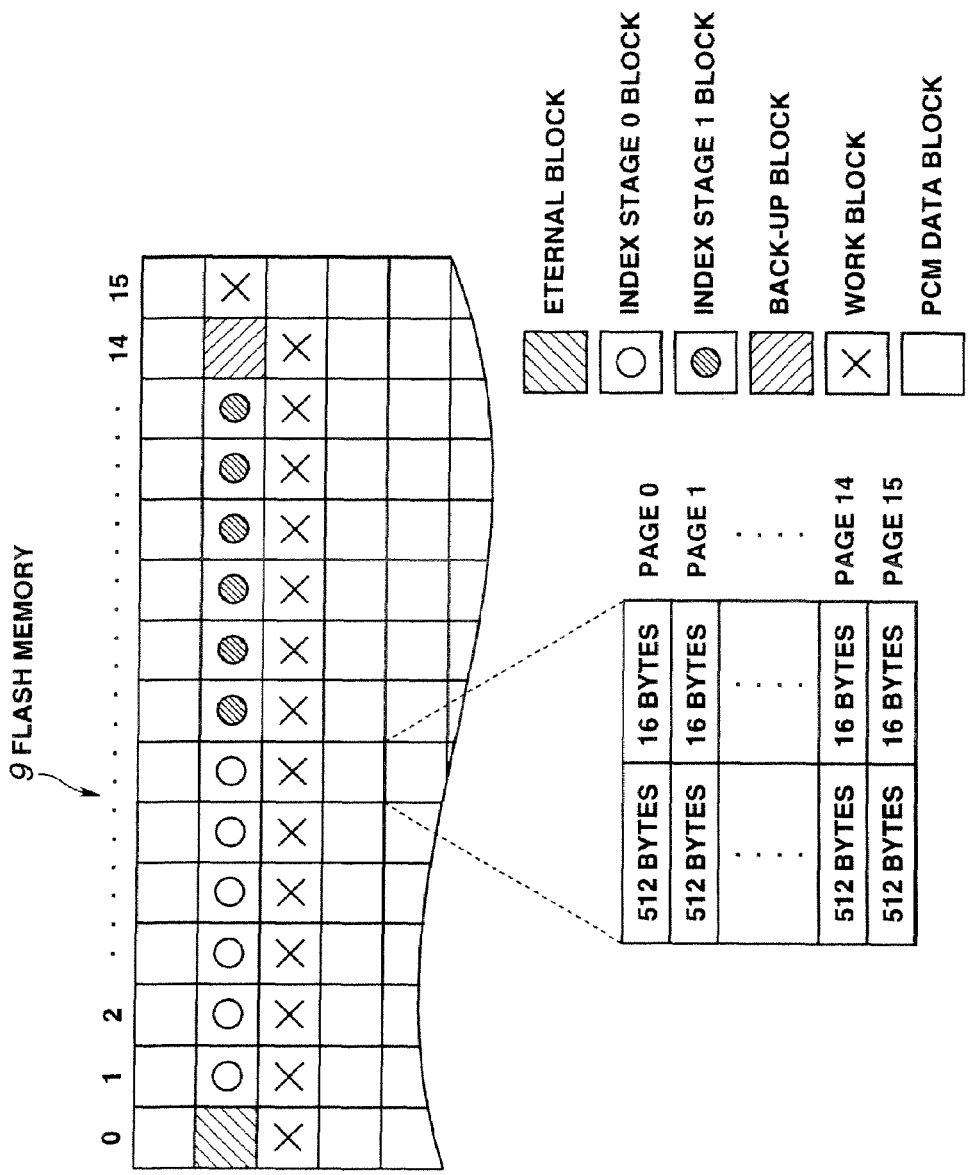
FIG. 3 shows a configuration of a semiconductor memory of the IC recorder.

Here, as shown in FIG. 3, when a sound data and other data are stored in the semiconductor memory 9, the data is divided into 512 blocks which are erase units. These blocks are grouped into six types as follows: an eternal block (1 block), index stage 0 blocks (6 blocks), index stage 1 locks (6 blocks), a back-up block (1 block), work area blocks (15 blocks), and PCM data blocks (469 blocks).

The aforementioned TOC information consists of the eternal block, index stage 0 block, index stage 1 block back-up block, and work area block. A sound data is written into PCM data blocks.

As shown in FIG. 3, each of the blocks consists of 16 pages (each page consisting of 528 bytes): page 0, page 1, . . . , page 14, page 15. Each one page consists of a 512-byte data area and a 16-byte redundant area. Ten blocks at maximum exist as blocks disabled for data recording and/or reproduction (hereinafter, referred to as invalid blocks).

The eternal block is provided other than at the first and the last blocks of the memory 9, .e., other than at the memory write-in or read-out start and end addresses. The eternal block contains a management information which is first to be read out from the memory 9. According to the data of the eternal block, the index stage 0 blocks and the index stage 1 blocks are read out. Thus, the eternal block is indispensable for reading out a data stored in the other blocks and accordingly located at a position other than the head and end addresses of the memory 9 which have the highest possibility of destruction upon an abnormal operation such as static electricity and an abnormal voltage. For example, if a block containing a sound data is destroyed, the data in the broken block can be erased so that a new sound data can be recorded without any problem. However, if the eternal block is destroyed, no data can be read out from the other blocks. To avoid such a situation, the eternal block is located, as has been described above, at other than the blocks of the memory 9 start and end addresses.

In the eternal block, only page 0 contains a data, and pages 1 to 15 contain no data. More specifically, as shown in FIG. 4, page 0 of the eternal block includes a 4-byte eternal block recognition data, 2-byte eternal block address, 2-byte index stage 0 address, 2-byte index stage 1 address, 2-byte work area block start address, 4-byte dummy data, and 128-byte blank map. The blank map indicates locations of the aforementioned invalid blocks.

The index stage 0 blocks and the index stage 1 blocks have an identical data configuration and these blocks are alternately rewritten for each sound data rewriting. That is, when a sound data is written in the memory 9, for example, a data in an index stage 0 block is rewritten, and when another sound data is written in the memory 9, a data in an index stage 1 block is rewritten. Hereinafter, these blocks will be referred to as index stage blocks in general.

As has been described, there are 6 index stage blocks for stage 0 and stage 1, respectively: five blocs containing a file data and one block containing a stage data.

FIG. 5 shows a configuration of an index stage block having a file data which consists of an ADR data block of page 0 to page 11 and an HDR block of page 12 to page 15.

FIG. 6 shows a configuration of the ADR data block, which has, for example, ID numbers 01 to 06; SP which indicates the recording mode SP or LP corresponding to a coding amount by the aforementioned encoder 14 for each of the files containing a sound data; STH indicating an upper start address and STM indicating a lower start address of the file; ENH indicating an upper end address and ENM indicating a lower end address of the file.

For example, when 6 sound data pieces are recorded, as shown in FIG. 7, in the ADR data block, index numbers 01 to 06 are recorded corresponding to the six sound data pieces. This index number is a data indicating a reproduction sequence of the six sound data pieces recorded. For each of the index numbers, recording mode (SP) together with a start address (STH, STM) and an end address (ENH, ENM) of the area containing the sound data are recorded. Because the sound of the index number 01 and the sound data of the index number 03 have a large capacity, as shown in FIG. 6, the index number 01 consists of two files and the index number 03 consists of four files, for example. In this case, for each of the files, a recording mode and a start address and an end address are recorded.

FIG. 7 shows a configuration of the HDR block. The following are recorded for each file; PRI indicating a file priority set by operation of the PRIORITY button 53 of the operation block 50; ALM indicating ON/OFF of the alarm setting by the operation of the MENU button 52; AMO, ADA, AHO, AMI, and AOW indicating the month, day, hour, minute, day of the week when the alarm is to be actuated. Here, as has been described above, the priority indicates a reproduction priority of a sound data when the sound data is reproduced. The HDR data block is updated when the priority or alarm setting is modified by operation of the PRIORITY button 53 and the MENU button 52 even if no sound data is updated.

On the other hand, the index stage block containing a stage data, as shown in FIG. 8, has a valid mark on page 0, a mode interruption mode on page 1, a blank map on page 2, an eternal block blank map on page 3.

The back-up block is a back-up for the aforementioned eternal block and is a copy of the eternal block. Consequently, when the eternal block is rewritten, the back-up block is also rewritten. There may be more than one back-up blocks.

The work area block is an area for temporarily recording an index data during a sound data recording. As show in FIG. 9, the work area block has an almost identical data configuration as the index stage block. The work area block contains an index number, SP/LP information indicating the recording mode, a sound data upper start address, a sound data lower start address, a sound data upper end address, a sound data lower end address, each of which consists of 1 byte. In this work area block, while reading data from the work area block, the index stage block is rewritten and the data such as the start address is directly written as it is.

The PCM data block is an area where a sound data is mainly recorded. AS shown in FIG. 10, in the PCM data block, each one page contains besides a sound data, the year, month, day, hour, minute, second, and day of the week created by the timer 33 are also recorded. More specifically, a 512-byte sound data, 1-byte data of year, 1-byte data of month, 1-byte data of day, 1-byte data of hour, 1-byte data of minute, 1-byte data of second, and 1-byte clock set flag are recorded on one page.

In the IC recorder 1 having the aforementioned configuration, if the REC button 56 is pressed when no recording or reproduction is carried out, the CPU 32 controls to write a sound data in the semiconductor memory 9. It is assumed that in the semiconductor memory 9, already six sound data pieces have been recorded as shown in FIG. 6.

More specifically, when the REC button 56 is pressed, the CPU 32 reads out from the ROM 31 and executes a program corresponding to the recording operation so that the amplifier 12, the AGC 13, and the encoder 14 are actuated and a sound data delayed with a predetermined time via the buffer memory 15 is stored in the PCM data block of the semiconductor memory 9.

For each of the data blocks, the CPU 32 stores a 512-byte sound data ad creates a data of the recording year, month, day, hour, and minute to be recorded together with the sound data in the PCM data block. The CPU 32 controls to write a sound data as one sound data piece in the PCM data blocks of the semiconductor memory 9 until the STOP button is pressed.

When the STOP button is pressed, the CPU 32 terminates to control to record the sound data in the PCM data blocks and rewrites the TOC information of the memory 9. More specifically, the index stage block is rewritten.

In the ADR data block of the index stage block containing a file data, the CPU 32 assigns an index number 01 to the 7-th sound data piece and writes in a data of mode setting, start address, and end address. The CPU 32 changes the previous index numbers 01 to 06 respectively to the index numbers 02 to 07 and writes in a data of the mode setting, start address, and end address of the respective index numbers.

Figure 11:
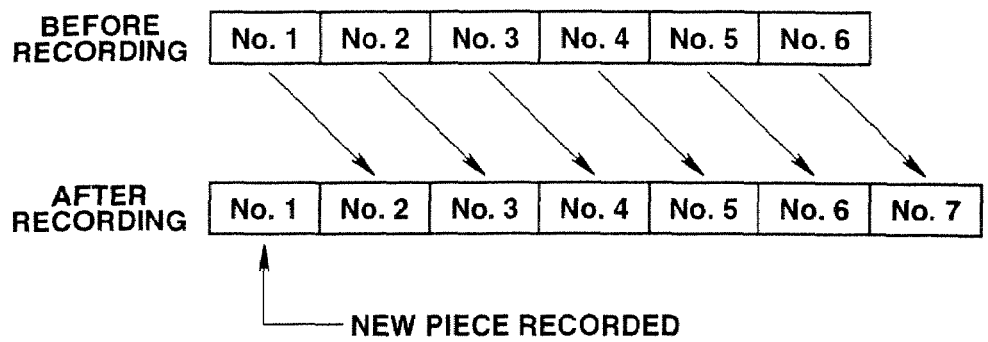
FIG. 11 explains a recording position of a new sound data stored.

This processing is illustrated in FIG. 11. The CPU 32 assigns the index number 01 to the latest 7-th sound data piece recorded and shift by 1 the previous index numbers 01 to 06 respectively to index numbers 02 to 07 and rewrites the TOC information. That is, the latest sound data piece is recorded in the memory 9 with the index number 1.

Next, explanation will be given on reproduction of a sound data.

If a user presses the jog dial shown in FIG. 2 in the direction of the arrow X when the apparatus 1 is in the stop state, the CPU 32 resumes a reproduction. That is, according to an eternal block recognition data of the eternal block from the memory 9, the CPU 32 recognizes the eternal block and reads out a data from this eternal block. It should be noted that if the CPU 32 fails to recognize the eternal block shown in FIG. 3, the CPU 32 recognizes the back-up block and reads out a data from this back-up block.

According to an index stage 0 address or index stage 1 address in the eternal block or in the back-up block, the CPU 32 reads out a data of the index stage block.

The CPU 32 uses the ADR data block of the index stage block containing a file data to control read-out of a sound data from PCM data blocks. Here, the CPU 32 reads out a sound data in the order of index number 01, index number 02, index number 03, . . . . More specifically, firstly, according to the start address (STH, STM) and end address (ENH, ENM) of the index number 01 in the ADR data block, the CPU 32 reads out a sound data of index number 01. The sound data which has been read out is converted into a sound signal via the decoder 21 and the filter 22 for supply to the loud speaker 24. Thus, the sound of index number 01 is outputted from the loud speaker 24.

The CPU 32 continues read-out of the sound data from the memory 9 until the STOP button 55 shown in FIG. 2 is pressed. That is, after the sound of index number 01 is outputted from the loud speaker 24, the CPU 32 reads out a sound data of index number 02, a sound data of index number 03, . . . in this order.

As has been described above, in the IC recorder 1, as shown in FIG. 11, when a new sound data is recorded, it is stored in the semiconductor memory 9 as the latest sound data of index number 01 so that reproduction is carried out in the order of index number 01, index number 02, index number 03, . . . . This is because a sound data of a smaller index number tends to be more important than a sound data of a greater index number. The aforementioned control enables to set an important sound data piece with an earlier index number. Thus, there is no need of searching an important latest sound piece, which enhances operationability.

Figure 12:
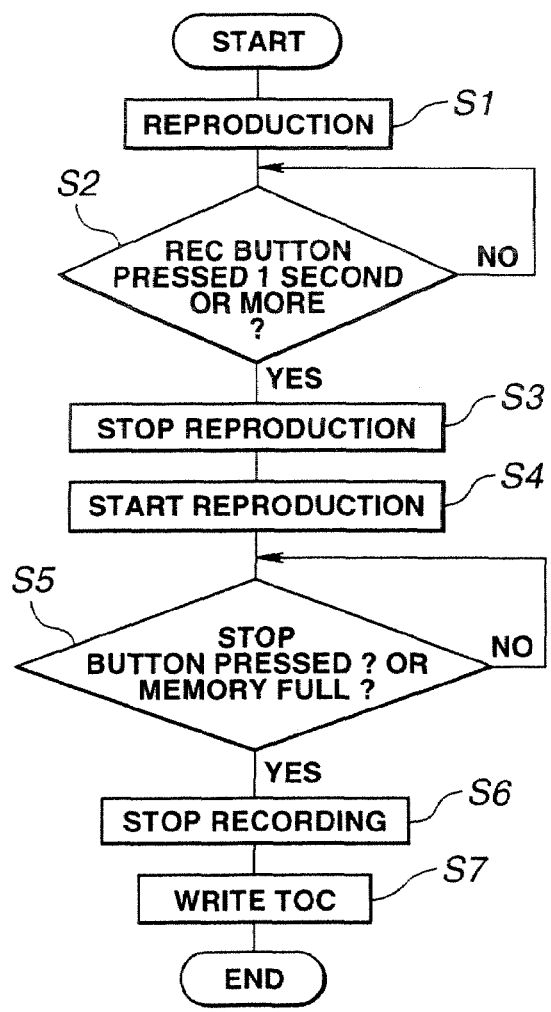
FIG. 12 is a flowchart explaining a CPU operation when additionally recording a new sound data as of ID number 02.

In the IC recorder 1, it is also possible to add another sound data to a sound data which has been recorded as an additional recording. Here, the CPU 32 executes a processing of step 1 and after shown in FIG. 12.

For example, if a user presses the REC button 56 while the IC recorder is reproducing a sound data of index number 02 (step S1), the CPU 32 actuates the timer 3 and determines whether the REC button 56 is pressed for 1 second or more (step S2). If it is determined that the REC button 56 has been pressed for 1 second or more, the CPU 32 interrupts the reproduction of the sound data of index number 02 (step S3), and if it is determined that the REC button 56 has not been pressed for 1 second or more, the CPU 32 continues the reproduction.

After the reproduction is interrupted, the CPU 32 controls to start recording of a sound inputted from the microphone 11 (step 4) and write the sound data in a PCM data block of the memory 9. The CPU 32 continues the recording until the STOP button 55 is pressed or the storage capacity of the semiconductor memory 9 becomes full (step S5). When the STOP button 55 is pressed or the storage capacity of the semiconductor memory 9 has become full, i.e., there is no more area for writing a sound data, the CPU terminates the recording (step S6).

After the reproduction is terminated, the CPU 32 executes rewriting of the TOC information of the sound data (step S7). More specifically, as shown in FIG. 13, in the ADR data block of the index stage block containing a file data, the CPU 32 firstly writes a start address (STH, STM) and end address (ENH, ENM) of the index number 01 and index number 02 which were present prior to the recording. Next, the CPU 32 controls to write a start address and end address indicating the recording position of a new sound data which has been recorded additionally as index number 02 and to write again the start address and the like of the sound data of index number 03 and after which were present prior to the recording. Thus, the CPU 32 assigns an index number 02 for a new sound data to be additionally recorded and writes its start address (STH, STM) and end address (ENH, ENM).

Figure 14:
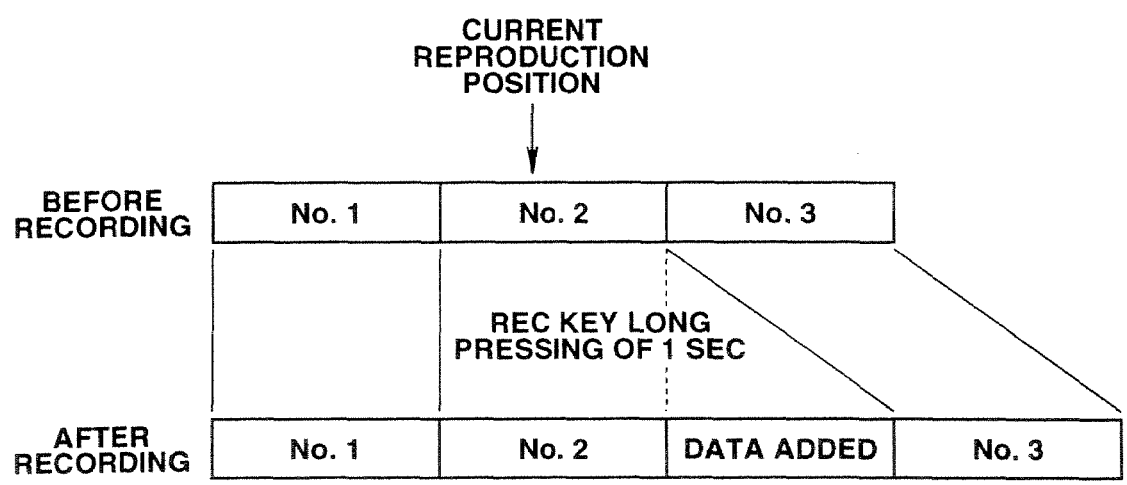
FIG. 14 explains a storage position of a new sound data additionally recorded as of ID number 02.

Consequently, in the C recorder 1, when the jog dial 60 is operated and reproduction is started, sound data reproduction is carried out in the order of index number 01, index number 02, . . . . Here, as shown in FIG. 14, the sound data piece additionally recorded is outputted as index number 02 immediately after the sound data portion of index number 02 which has been recorded in advance.

That is, in the IC recorder 1, it is possible to select one piece from a plurality of pieces already recorded and additionally record a new piece to be added to the selected piece. Thus, the user can record a new data piece with a desired index number to be added to the selected one of the pieces already recorded. This enables to significantly enhance the operationability, eliminating time required for searching a desired piece. This additional recording can be carried out without changing the operation block 50 and accordingly without increasing production costs.

In the aforementioned embodiment, explanation has been given on a case an additional recording mode is set in when the REC button 56 is pressed for 1 second or more while a predetermined file is read out from the memory 9 and reproduced, but the additional recording mode is not to be limited to this case.

For example, the additional recording mode can be set by the CPU 32 if the REC button 56 is pressed for predetermined period of time (for example, 2 seconds) after the reproduction f file of index number 02 is interrupted by a user. When the additional recording mode is set in, the CPU 32 executes the processing of step S4 and after so as to record a new sound data as of index number 02 in the semiconductor memory 9.

Next, explanation will be given on the reproduction operation using the jog dial 60 and the configuration of the jog dial 60. In the IC recorder 1, a portion of the jog dial 60, i.e.;, a portion of the rotational operation member which will be detailed later, is exposed from a cut-off portion 2c formed on the upper half of the left side surface 2b of the external casing 2. This jog dial 60 includes a disc-shaped rotation operation member 61 having a rotation center shaft 62 and other members which will be detailed later and most of the members of the jog dial are contained in the external casing 2 and only a portion of the rotary operation member 61 is exposed outside from the cut-off portion 2c. The rotation operation member 61 of the jog dial 60 can be rotated around the rotation center shaft 62 in the directions of A and B indicated in FIG. 2.

Furthermore, the rotary operation member 61 of the jog dial 60 is provided in such a manner that the rotary center shaft 62 can be moved in side the external casing 2 in the directions of X and Y indicated in FIG. 2. In a normal state, i.e., when the jog dial 60 is in a non-operation state, the member 61 is urged by a spring (not depicted) in the direction of arrow Y so that a portion of the member 61 protrudes from the cut-off portion 2c. Accordingly, the rotary operation member 61 of the jog dial 60 can be operated by a user so as to rotate in the directions of arrow A and arrow B indicated in FIG. 2 as well as to move by pressing along plane when almost orthogonally intersects the rotation center shaft 62, i.e., in the direction indicated by arrow X in FIG. 2, which brings the rotary operation member 61 inside the external casing 2.

When this rotary operation member 61 is rotated in the direction of arrow A or B indicated in FIG. 2, the jog dial 60 supplies an output signal according to the rotation angle and rotation speed to the control block 30. When this rotary operation member 61 is pressed in the direction of arrow X indicated in FIG. 2, an output signal corresponding to the pressing time of the member 61 is supplied to the control block 30. More specifically, in the IC recorder 1, the control block 30 detects the rotation direction, rotation angle, and rotation speed of the rotary operation member 61, or detects whether the rotary operation member 61 is pressed and whether the pressing of the rotary operation member 61 exceeds a predetermined period of time. The control block 30 reads out a program from the ROM 31 corresponding to a detection result and executes the program so as to control the operation of the respective components of the apparatus 1. It should be noted that the control operation by this control block 30 will be detailed later.

This jog dial 60 is operated by a user in various cases including a case to carry out various operations in reproduction or a case to modify the initial setting of the aforementioned date and time. That is, this jog dial 60 is used with a high frequency. For this, the jog dial 60 is provided at the side surface of the external casing 2 as shown in FIG. 2 so that the user can hold the external casing 2 with his/her left hand and rotate and press the rotary operation member 61 which partially protrudes from the cut-off portion 2c with his/her left hand thumb alone.

Figure 15A:
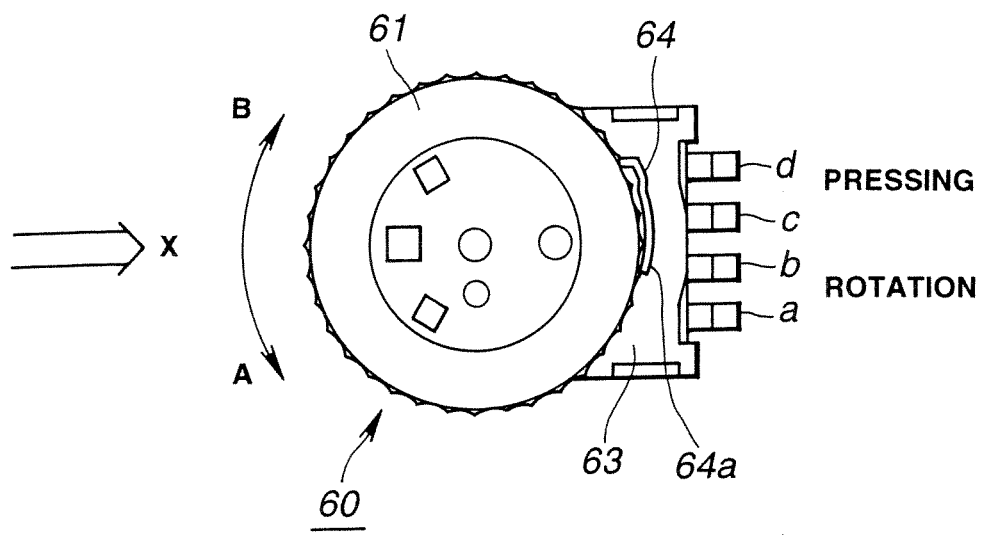
FIG. 15A and FIG. 15B explain a configuration of a jog dial.
Figure 15B:
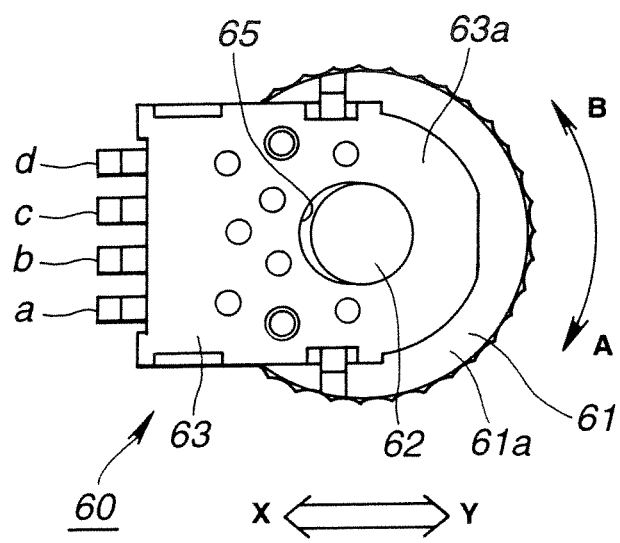
Figures 16, 17:
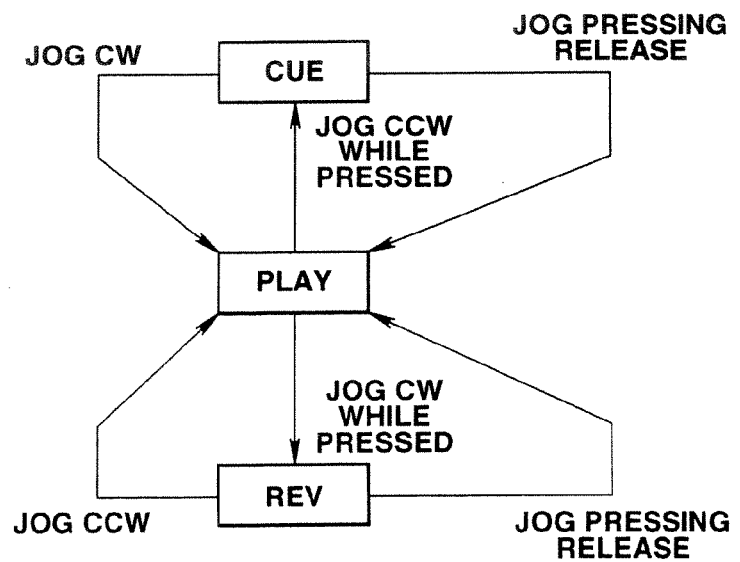
FIG. 16 shows rotation directions of a rotation operation member in connection with signals outputted as a result of a jog dial rotation operation together with corresponding output waveforms.
FIG. 17 explains an operation of a rotary operation member associated with a cue/review reproduction and a reproduction state transition corresponding to the operation of the rotary operation member.

Referring to FIG. 15A, FIG. 15B, and FIG. 16, configuration of this jog dial 60 will be detailed below. FIG. 15A is a front view of the jog dial 60, i.e., an external view from the main surface 2a of the external casing 2. FIG. 15B is an external view from the rear face. As shown in FIG. 15A and FIG. 15B, the jog dial 60 includes the aforementioned rotary operation member 61, a base member on which this rotary operation member 61 is attached, a leaf-spring-shaped electrode 64, and four terminals a, b, c, and d which are mounted on the base member 63.

The base member 63 is made from an insulating material and has a main surface portion 63a attached inside the external casing 2 so that the entire jog dial 60 is fixed to the external casing 2. As shown in FIG. 15B, the base member 63 has a cut-off portion 65 of an elliptic shape having a longer axis in the direction of arrows X and Y. In the cut-off portion 65 is fitted the rotation center shaft 62 of a circular shape provided at the center of one main surface 61a of the rotary operation member 61 in such a manner that the shaft 62 can be rotated and shifted in the directions indicated by the arrows X and Y in FIG. 15B along a plane which almost orthogonally intersects the rotation center shaft 62.

The electrode 64, as shown in FIG. 15A, is made from a leaf spring which has been bent. The electrode 64 has a base end fixed to the base member 63. The plurality of terminals a, b, c, and d attached to the base member 63 are respectively connected to the control block 30 shown in FIG. 1. Here, the terminals a and b function to output an output signal based on the rotation of the rotary operation member 61. The terminal d functions to supply an input signal based on the pressing of the rotary operation member 61 in the direction of arrow X. The terminal c serves as a common grounding for the terminals a, b, and d.

When the rotary operation member 61 is pressed in the direction of arrow X, a tip end 64a of the electrode 64 is moved in the direction indicated by arrow X and brought into contact with the other electrode (not depicted). When the electrode 64 is brought into contact with this other electrode (not depicted), the jog dial 60 supplies an output signal from terminal d to the control block 30 which signal indicating that the rotary operation member 61 is pressed by the user. When the pressing of the rotary operation member 61 is stopped, the contact between the electrode 64 and the other electrode (not depicted) is released and supply of the output signal from terminal d to the control block 30 is terminated. The control block 30 detects the output signal supplied from terminal d indicating that the rotary operation member 61 is pressed and detects whether supply of this signal from terminal d has continued for a predetermined period of time. According to a result of the detection, the control block 30 reads out from the ROM 31 a program corresponding to the detection result and executes operation or control according to the program which has been read out.

As shown in FIG. 16, when the rotary operation member 61 is rotated in the direction of arrow A or B, the jog dial 60 outputs a 2-phase pulse signal. That is, if the rotary operation member 61 is rotated clockwise, i.e., in the direction of arrow B, a signal $\alpha$ is outputted from between the terminals a-c and a signal $\beta$, from between the terminals b-c with different phases from each other. Similarly, if the rotary operation member 61 is rotated counterclockwise, i.e., in the direction of arrow A, a signal $\alpha$ is outputted from between terminals a-c and a signal $\beta$, from between the terminals b-c with different phases from each other. As shown in FIG. 16, a pulse signal is outputted in such a manner that when the rotary operation member 61 is rotated clockwise, the signal $\beta$ is slightly delayed from the signal $\alpha$, and when the rotary operation member 61 is rotated counterclockwise, the signal $\alpha$ is slightly delayed from signal $\beta$. Consequently, the control block 30 can identify the rotation direction of the rotary operation member 61 by detecting which of the signals $\alpha$ and $\beta$ has a delayed phase.

While the jog dial 60 is rotated by 360 degrees clockwise or counterclockwise, a pulse is generated 15 times by the signal α and signal β, respectively. That is, when the rotary operation member 61 is rotated by 1/15 turn (24 degrees), a pulse is generated by once by the signal α and signal β, respectively. Consequently, the control block 30 can detect the rotation angle of the rotary operation member 61 by counting the number of pulses by using the counter 35. Furthermore, by counting the number of pulses for a predetermined period of time by using the counter 35, the control block 30 can detect a rotation speed of the rotary operation member 61.

In the IC recorder 1 having the aforementioned configuration, for example, if the FILE button 51 is pressed prior to carrying out a recording, the control block 30 controls to read out a data from the ROM 31 and icons corresponding to various files appear on the liquid crystal panel 41. One of the icons on the display panel 41 can be selected by rotating the rotary operation member 61 of the jog dial 60 in the direction of arrow A or B in FIG. 2 and the selected icon can be specified by pressing the rotary operation member 61 in the direction of arrow X so that a new sound data will be stored in the specified file. If the MENU button 52 is pressed prior to carrying out a recording, the control block 30 reads out from the ROM 31 a data on the initial setting and a initial setting state appears on the liquid crystal display panel 41. In order to modify a current initial setting, the rotary operation member 61 is rotated in the direction of arrow A or B so as to select a target item. When this selection is complete, the rotary operation member 61 is pressed in the direction of arrow X so that the selected item can be modified. In this state, the rotary operation member 61 is rotated and pressed to modify the initial setting.

When the REC start button 55 of the IC recorder 1 is pressed, the IC recorder 1 enters a recording start state. When the user speaks something toward the microphone 11, a sound data is written in a PCM data block of the semiconductor memory 9 specified by the aforementioned operation of the jog dial 60. When the STOP button is pressed, the recording state is released. When the sound data is recorded in the semiconductor memory 9, the aforementioned TOC information and a data on the file number and index number are created as an auxiliary data or a management data by the control block 30 and written into the memory 9.

Next, explanation will be given on reproduction of a sound data recorded or stored in the IC recorder 1. In the same way as in recording, for example, the FILE button 51 is pressed so that a data is read out from the ROM 31 by the control block 30 and icons corresponding to various files appear on the liquid crystal panel 41. The rotary operation member 61 of the jog dial 60 is rotated in the direction of arrow A or B to select one of the icons on the liquid crystal panel 41. When the selection is complete, the rotary operation member 61 is pressed in the direction of arrow X so as to specify the selected icon so that a sound data stored in PCM data blocks of the specified file will be reproduced. On the liquid crystal panel 41 of FIG. 2, only 02/37 associated with the index number is displayed for convenience of explanation, but actually, various icons and time appear on the liquid crystal panel 41. In the example of FIG. 2, the denominator 37 represents the number of sound data pieces stored in the memory 9, and the numerator 02 represents the index number which is currently reproduced or which can be reproduced immediately. In this case, a file contains 37 sound data pieces stored in the memory 9 and a sound data of index number 02 is being reproduced or in a state to be reproduced immediately.

Here, when the IC recorder 1 is in the state to be reproduced immediately, reproduction of the sound data of the selected index number is started by operating the rotary operation member 61 of the jog dial 60 as follows.

When the rotary operation member 61 is rotated counterclockwise, i.e., in the direction of arrow A, the control block 30 executes a forward search. More specifically, according to the number of pulses based on the signals α and β shown in FIG. 16, the control block 30 reads out later index numbers from the semiconductor memory 9 so as to be successively displayed on the liquid crystal panel 41 (in this case, 03/37, 04/37, 05/37 . . . ). On the other hand, if the jog dial 60 is rotated clockwise, i.e., in the direction of arrow B, the control block executes a backward search. More specifically, according to the number of pulses based on the signals α and β, the control block 30 reads out earlier index numbers from the semiconductor memory 9 (in this case, 01, 37, 36 . . . ) so as to be successively displayed on the liquid crystal panel 41.

When the user has found the index number of the sound data to be reproduced and presses the rotary operation member 61, the control block 30 detects an output signal supplied from the terminal d of the jog dial 60 and controls to read out from the memory 9 the sound data corresponding to the index number selected by operation of the jog dial 60 and start reproduction of the sound data. In this reproduction state, if the rotary operation member 61 is pressed in the direction of arrow X for a short period of time (hereinafter, this operation will be referred to as a short pressing), the control block 30 controls to terminate the sound data reproduction. If the rotary operation member 61 is pressed in the direction of arrow X in this reproduction state for a period of time longer than a predetermined period of time (hereinafter, this operation will be referred to as a long pressing), the control block 30 executes a repeat reproduction which will be detailed later.

Next, explanation will be given on various functions upon reproduction in the IC recorder 1. The IC recorder 1 has, during a reproduction, a function of cue/review reproduction, a function of repeat reproduction, and a function of scan reproduction. These functions can be selected and executed by operating the rotary operation member 61 of the jog dial 60 alone.

FIG. 17 shows operations of the rotary operation member 61 associated with the cue/review reproduction in relation to the reproduction state transition. Note that in FIG. 17, the rotary operation member 61 is indicated simply as JOG. In order to carry out the cue/review, when or after starting a reproduction, this rotary operation member 61 is continuously pressed in the direction of arrow X while rotated in the direction of arrow A or B by a predetermined angle. As shown in FIG. 7, in this embodiment, if the rotary operation member 61 is continuously pressed in the direction of arrow X while rotated counterclockwise, i.e., in the direction of arrow A, the control block 30 controls to execute a cue reproduction, and if the rotary operation member is continuously pressed in the direction of arrow X while rotated clockwise, i.e., in the direction of arrow B, control is made to carry out a review reproduction. This cue/review reproduction operation is continuously carried out while the rotary operation member 61 is maintained in the pressed state in the direction of arrow X, assuming that, for example, a sound data is reproduced with a speed 10 times faster than a normal reproduction speed. On the other hand, if the pressing of the rotary operation ember 61 in the direction of arrow X is released and supply of the output signal from the terminal d of the job dial 60 terminates, the control block 30 terminates this cue/review reproduction operation and switches the mode to the normal speed reproduction. As shown in FIG. 17, the control block 30 also controls to switch the mode to the normal speed reproduction if the rotary operation member 61 is rotated clockwise, i.e., in the direction of arrow B during a cue reproduction, or if the rotary operation member 61 is rotated counterclockwise, i.e., in the direction of arrow A during a review reproduction.

In the embodiment of the present invention, when the cue reproduction reaches the end of the sound data stored in the memory 9, control is made to interrupt the cue reproduction and set the mode to the head of the last sound data stored in the memory 9. On the other hand, when the review reproduction reaches the first sound data stored in the memory 9, control is made to interrupt the review reproduction and set mode to the head of the sound data stored in the memory 9. Thus, in the IC recorder 1, control is made in such a manner that a cue reproduction or a review reproduction will not be terminated other than at the first and the last positions of the sound data stored in the memory 9. For example, a cue reproduction or a review reproduction will not be terminated at a sound data of index number 03 when a sound data of index numbers 01 to 10 is stored.

If a long pressing of the rotary operation member 61 is carried out during a sound data reproduction, the control block 30 executes a repeat reproduction of the sound data piece which is being reproduced. In the embodiment of the present invention, the sound data piece which has been reproduced is repeatedly reproduced by the repeat reproduction. During this repeat reproduction, if the rotary operation member 61 is pressed again in the direction of arrow X or rotated in the direction of arrow A or B, the repeat reproduction is released and mode is switched to the normal reproduction. Also, if the STOP button 54 or ERASE button 56 is pressed during a repeat reproduction, the repeat reproduction is released and the normal reproduction mode is set in.

Figure 18:
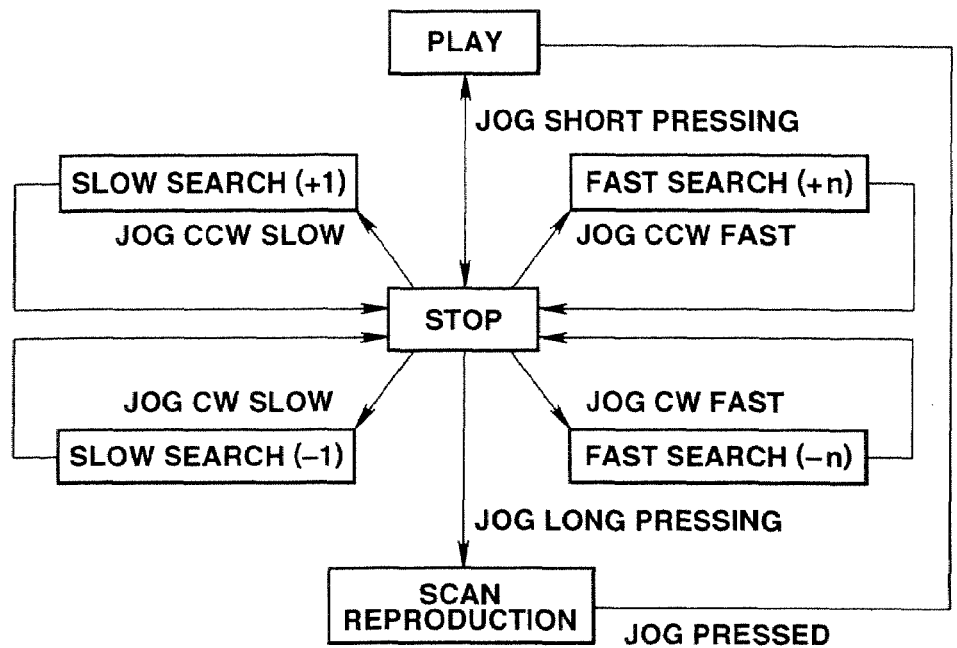
FIG. 18 a processing carried out when the rotary operation member is rotated or pressed in a stop state.

As shown in FIG. 18, if a long pressing of the rotary operation member 61 is carried out in the state to be reproduced immediately or in the stop state, the control block 30 executes a scan reproduction. That is, if the rotary operation member 61 is continuously pressed in the direction of arrow X for a predetermined period of time in the state to be reproduced immediately, the control block 30, according to an output signal from the terminal d, detects the period of time during which the rotary operation member 61 is pressed and controls to start a scan reproduction. Here, the scan reproduction is a reproduction method as follows. When a plurality of sound data pieces are stored in a file of the memory 9, starting portions of the respective sound data pieces stored in the file are reproduced intermittently and successively for a predetermined period of time (5 seconds for example) for each of the data pieces. Note that in FIG. 18, the rotary operation member 61 is indicated simply as JOG.

Here, the control block 30 determines whether to execute a scan reproduction by detecting, for example, whether an output signal from terminal d of the jog dial 60 based on the pressing of the rotary operation member 61 in the direction of arrow X is detected for 3 seconds or more continuously. That is, if the output signal from the terminal d is detected for 3 seconds or more from a start of pressing of the rotary operation member 61, the control block 30 controls to execute a scan reproduction, and if less than 3 seconds from the start of pressing, the control block 30 executes a normal mode reproduction.

After a scan reproduction is started, the scan reproduction continues even if the pressing of the rotary operation member 30 in the direction of arrow X is released. When the scan reproduction of the last sound data piece of the file which is being scan-reproduced is complete, the control block 30 stops the IC recorder 1 at the head of the first sound data piece of the file which has been scan-reproduced. @

During a scan reproduction, if the rotary operation member 61 is rotated in the direction of arrow A or B, the control block 30 controls to switch to a scan reproduction of a sound data of an index number earlier or later by a count value of the counter 35 determined by the number of pulse signals generated by the rotation of the rotary operation member 61. During this scan reproduction, if a target voice is heard from the loud speaker 24, the user presses the rotary operation member 61 in the direction of arrow X while the target sound data is being reproduced. When the rotary operation member 61 is pressed, as shown in FIG. 18, the control block 30 controls to switch to a normal mode reproduction. Thus, by pressing the member 61 while a scan reproduction is in progress, it is possible to hear the target sound data from the beginning to the end. If the STOP button 54 is pressed during a scan reproduction, the control block 30, according to an input signal fro the operation block 50, releases the scan reproduction and enters a stop state.

In this example, if the ERASE button 56, the FILE button 51, or the PRIORITY button 53 is pressed during a scan reproduction, the control block 30 invalidates the input signal issued by pressing these button regardless of the ON/OFF state of the HOLD switch.

In the IC recorder 1, when the rotary operation member 61 is rotated in the direction of arrow A or B, as has been described above, the control block 30 detects the signals α and β based on the output from the terminals a, b, and c of the jog dial 60 to determine the rotation speed of the rotary operation member 61 and executes a processing corresponding to the detected speed.

FIG. 18 also shows a processing carried out when the rotary operation member 61 is rotated from the STOP state. As shown in FIG. 18, when the rotary operation member 61 is rotated counterclockwise, i.e., in the direction of arrow A from the STOP state, if the rotation speed of the rotary operation member 61 is slow, the control block 30 controls to execute a forward direction search piece by piece and to increment the index number on the liquid crystal panel 41 one by one as the search proceeds. On the other hand, if the rotation speed of the rotary operation member 61 in the direction of arrow A is fast, the control block 30 controls to execute a forward direction search while skipping a number of pieces and to increment the index number of the liquid crystal display panel 41 by more than one at once.

Similarly, when the rotary operation member 61 is rotated clockwise, i.e., in the direction of arrow B from the STOP state at a slow rotation speed, the control block 30 controls to execute a backward direction search piece by piece and decrement the index number on the liquid crystal display panel 41 one by one. On the other hand, if the rotation speed of the rotary operation member 61 in the direction of arrow B is fast, the control block 30 executes a backward direction search while skipping a number of pieces and decrement the index number on the liquid crystal display panel 41 by more than one at once.

Thus, in the IC recorder 1, even if a plenty of sound data pieces are stored in the semiconductor memory 9 with the corresponding index numbers, it is possible to carry out a fast rotation of the rotary operation member 61 so that a number of index numbers are skipped so as to quickly find a target index number, i.e., to display the target index number on the liquid crystal display panel 41. Accordingly, in this IC recorder 1, an index number search prior to a reproduction is significantly improved, enabling to quickly reproduce a target sound data with a simple operation.

Figure 19:
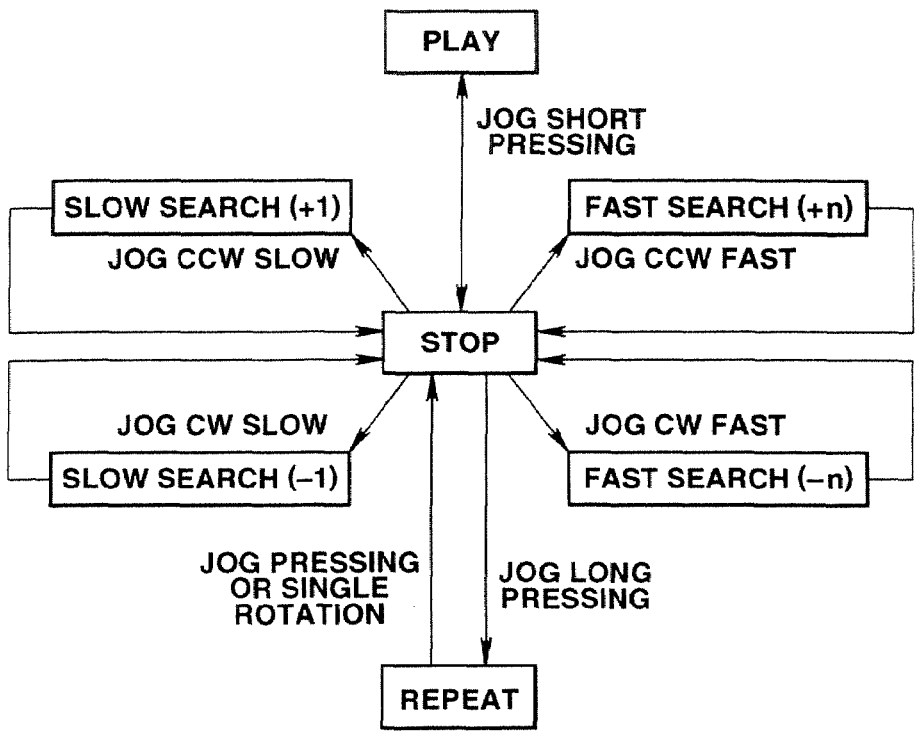
FIG. 19 shows a processing carried out when the rotary operation members rotated or pressed in a sound data reproduction state.

FIG. 19 shows a processing carried out when the rotary operation member 61 is rotated in the direction of arrow A or B from a sound data reproduction state. As shown in FIG. 19, in the IC recorder 1, when the rotary operation member 61 is rotated counterclockwise, i.e., in the direction of arrow A from a reproduction state with a slow rotation speed, the control block 30 controls to execute a forward direction search piece by piece. More specifically, the control block 30 controls to increase the index number on the liquid crystal panel 41 one by one and start reproduction at the head of a sound data of the displayed index number. On the other hand, if the rotary operation member 61 is rotated with a fast rotation speed, the control block controls to execute a forward direction search while skipping a number of pieces. More specifically, the control block 30 controls to increment the index number on the liquid crystal panel 41 by more than one at once and start a reproduction at the head of a sound data corresponding to the displayed index number.

Similarly, when the rotary operation member 61 is rotated clockwise, i.e., in the direction of B from a reproduction state, if the rotation speed f the rotary operation member 61 is slow, the control block 30 controls to execute a backward direction search piece by piece. More specifically, the control block 30 controls to decrement the index number on the liquid crystal display panel 41 one by one and start reproduction at the head of a sound data corresponding to the displayed index number. On the other hand, if the rotation speed of the rotary operation member 61 is fast, the control block 30 controls to execute a backward direction search while skipping a number of pieces. More specifically, the control block 30 controls to decrement the index number of the liquid crystal display panel 41 by more than one at once and start reproduction at the head of a sound data corresponding to the displayed index number.

Thus, in the IC recorder 1, even if there are a number of sound data pieces stored in the semiconductor memory 9, a simple operation of fast rotation of the rotary operation member 61 enables to quickly find and reproduce the head portion of a target sound data by skipping a number of sound data pieces. This significantly enhances the sound data search efficiency during a reproduction.

As has been described above, in the IC recorder 1, various functions are assigned to the jog dial 60. This enables to improve the operationability as well as to reduce the size and weight of the entire apparatus. More specifically, a user can carry out all the basic operations during a reproduction with his/her left hand thumb alone to rotate and press the rotary operation member 61 without moving his/her fingers here and there. Because a number of functions are assigned to the jog dial 60, it s possible to reduce the number of operation buttons and switches as a whole, which facilitates operation of the IC recorder 1 in the visual way as well as realizes reduction of the size and weight of the entire apparatus.

The aforementioned storage and reproduction apparatus according to the present invention uses a semiconductor memory. The present invention is not to be limited to the aforementioned embodiment but can be applied to recording apparatuses in general, especially portable type apparatuses which can easily be carried. In the aforementioned embodiment, a sound data recording and reproduction apparatus was detailed, but the present invention may be a recording and reproduction apparatus for recording/reproducing other than a sound data such as a video data.

What is claimed is:

1. A reproduction apparatus comprising:
    a storing unit configured to store content data to a storage;
    a reproduction unit configured to reproduce said content data;
    an operation unit configured to be operated by rotational input of a user;
    a detecting unit configured to detect a speed of the rotational input; and
    a control unit configured to control a search range of a plurality of the content data stored in said storage based on the speed,
    wherein said content data includes a main data and a corresponding associated data, and said control unit performs a skip search by skipping an index of each content data based on said associated data when said speed of said rotational input is over than said predetermined speed.

2. The reproduction apparatus according to claim 1, wherein said control unit controls to search by increasing indexes of said plurality of said content data based on a direction of said rotational input.

3. The reproduction apparatus according to claim 1, said control unit controls to search by decreasing indexes of said plurality of said content data based on a direction of said rotational input.

4. The reproduction apparatus according to claim 1, said control unit controls to reproduce said content data when searched content data is confirmed to be reproduced.

5. The reproduction apparatus according to claim 1, said control unit controls to cue-reproduce said content data based on a direction of said rotational input when said content data is being reproduced.

6. The reproduction apparatus according to claim 5, said control unit controls a reproduction speed based on said speed of said rotational input.

7. The reproduction apparatus according to claim 1, said control unit controls to review-reproduce said content data based on a direction of said rotational input when said content data is being reproduced.

8. The reproduction apparatus according to claim 1, said operation unit can be pressed into the inner side of a case of said reproduction apparatus and control unit controls to start a reproduction of said content data when said operation unit is pressed.

9. The reproduction apparatus according to claim 1, wherein said content data includes at least one of audio data and video data.

10. The reproduction apparatus according to claim 1, wherein said storage is a memory.

11. The reproduction apparatus according to claim 1, wherein said control unit performs a skip search by skipping an associated data of each content data based on the search range.

12. The reproduction apparatus according to claim 1, wherein the reproduction apparatus is portable.

13. The reproduction apparatus according to claim 1, wherein the rotational input is a circular path around an imaginary rotational axis, the imaginary rotational axis being perpendicular to a main surface of said reproduction apparatus.

14. The reproduction apparatus according to claim 1, further comprising:
    a display configured to display at least the associated data selected by said control unit.

15. The reproduction apparatus according to claim 1, wherein the associated data includes a start address and an end address of said input data and includes data indicating a reproduction order.

16. The reproducing apparatus according to claim 1, further comprising:
    a microphone to generate audio data based on inputted audio signal, and wherein the control unit controls the storing unit to store the audio data.

17. A reproduction apparatus comprising:
a storing unit configured to store content data to a storage;
a reproduction unit configured to reproduce said content data;
an operation unit configured to be operated by rotational input of a user, the rotational input being a circular path around an imaginary rotational axis, the imaginary rotational axis being perpendicular to a main surface of said reproduction apparatus;
a detecting unit configured to detect a speed of the rotational input;
a control unit configured to control a search range of a plurality of the content data stored in said storage based on the speed; and
a menu control located at a position of the circular path and coplanar with respect to the main surface of the portable apparatus.

18. The reproducing apparatus according to claim 17, further comprising:
a microphone to generate audio data based on inputted audio signal, and wherein the control unit controls the storing unit to store the audio data.

19. The reproduction apparatus according to claim 17, wherein said content data includes a main data and a corresponding associated data, and said control unit performs a skip search by skipping an index of each content data based on said associated data when said speed of said rotational input is over than said predetermined speed.

20. The reproduction apparatus according to claim 17, wherein said control unit controls to search by increasing indexes of said plurality of said content data based on a direction of said rotational input.

21. The reproduction apparatus according to claim 17, said control unit controls to search by decreasing indexes of said plurality of said content data based on a direction of said rotational input.

22. The reproduction apparatus according to claim 17, said control unit controls to reproduce said content data when searched content data is confirmed to be reproduced.

23. The reproduction apparatus according to claim 17, said control unit controls to cue-reproduce said content data based on a direction of said rotational input when said content data is being reproduced.

24. The reproduction apparatus according to claim 23, said control unit controls a reproduction speed based on said speed of said rotational input.

25. The reproduction apparatus according to claim 17, said control unit controls to review-reproduce said content data based on a direction of said rotational input when said content data is being reproduced.

26. The reproduction apparatus according to claim 17, said operation unit can be pressed into the inner side of a case of said reproduction apparatus and control unit controls to start a reproduction of said content data when said operation unit is pressed.

27. The reproduction apparatus according to claim 17, wherein said content data includes at least one of audio data and video data.

28. The reproduction apparatus according to claim 17, wherein said storage is a memory.

29. The reproduction apparatus according to claim 17, wherein said control unit performs a skip search by skipping an associated data of each content data based on the search range.

30. The reproduction apparatus according to claim 17, wherein the reproduction apparatus is portable.

31. The reproduction apparatus according to claim 17, further comprising:
a display configured to display at least the associated data selected by said control unit.

32. The reproduction apparatus according to claim 17, wherein the associated data includes a start address and an end address of said input data and includes data indicating a reproduction order.

* * * * *